United States Patent
Takano

[19]

[11] Patent Number: 6,097,206
[45] Date of Patent: Aug. 1, 2000

[54] MEMORY TESTER AND METHOD OF SWITCHING THE TESTER TO RAM TEST MODE AND ROM TEST MODE

[75] Inventor: Kazuo Takano, Saitama, Japan

[73] Assignee: Advantest Corporation, Toyko, Japan

[21] Appl. No.: 09/077,961

[22] PCT Filed: Oct. 14, 1997

[86] PCT No.: PCT/JP97/03692

§ 371 Date: Jun. 11, 1998

§ 102(e) Date: Jun. 11, 1998

[87] PCT Pub. No.: WO98/16933

PCT Pub. Date: Apr. 23, 1998

[30] Foreign Application Priority Data

Oct. 15, 1996 [JP] Japan ................................. 8-271933

[51] Int. Cl.[7] .......................... G01R 31/26; G11C 29/00
[52] U.S. Cl. ................................. 324/765; 714/723
[58] Field of Search .................. 324/765; 714/718, 714/719, 720, 723, 735, 736, 737; 365/201

[56] References Cited

U.S. PATENT DOCUMENTS 4,384,348  5/1983  Nozaki ................................ 365/201
4,876,685  10/1989  Rich .................................... 714/723
5,170,398  12/1992  Fujieda et al. ....................... 714/742
5,831,988  11/1998  Fagerness ............................ 714/719
5,835,428  11/1998  Kobayashi ........................... 365/201

Primary Examiner—Josie Ballato
Assistant Examiner—Russell M. Kobert
Attorney, Agent, or Firm—Gallagher & Lathrop; David N. Lathrop

[57] ABSTRACT

The circuit arrangement of a memory testing apparatus having a ROM expected value memory is simplified. There are provided a first logical comparator 26 for logically comparing a data read out of a memory under test 200 with an expected value data from a pattern generator 11 as well as a second logical comparator 28 having its one input terminal supplied with a result of the comparison in the first logical comparator 26. The second logical comparator 28 has the other input terminal to be supplied with a ROM expected value data read out of a ROM expected value memory 16. A data read out of a RAM under test is logically compared in the first logical comparator 26 while a data read out of a ROM under test is logically compared in the second logical comparator 28.

14 Claims, 3 Drawing Sheets

MEMORY TESTER AND METHOD OF SWITCHING THE TESTER TO RAM TEST MODE AND ROM TEST MODE

TECHNICAL FIELD

The present invention relates to a memory testing apparatus provided with a ROM (read only memory) expected value memory, which is capable of testing both a writable/readable memory called RAM (random access memory) and a read only memory called ROM, and to a method of switching the operation mode of the testing apparatus between a RAM test mode and a ROM test mode.

BACKGROUND ART

A memory testing apparatus for testing a writable/readable memory (hereinafter referred to as RAM) generally comprises a timing generator, a pattern generator, a waveform generator, a logical comparator and a failure analysis memory. As is well known, a RAM and a read only memory (hereinafter referred to as ROM) are often formed as a semiconductor integrated circuit element. In the following description, in order to facilitate understanding of the present invention, a case will be discussed in which a memory as constructed in the form of a semiconductor integrated circuit element (hereinafter referred to as IC memory) is tested by such memory testing apparatus, but it is to be noted that the memory testing apparatus can also test memories other than IC memories.

A pattern generator is operative, in response to a reference clock (operating clock) fed from the timing generator, to generate address pattern data, test pattern data, control signals and the like which are to be applied to an IC memory to be tested (memory under test), and also to generate expected value pattern data and the like which are to be supplied to the logical comparator.

An IC memory to be tested (commonly called MUT (memory under test)) is controlled in writing of a test pattern signal therein or reading of a test pattern signal therefrom by application of a control signal thereto. Specifically, when a writing control signal is applied to the IC memory under test, a test pattern signal is successively written in the IC memory under test at an address thereof specified by an address pattern signal, and when a reading control signal is applied to the IC memory under test, the test pattern signal previously written in the IC memory under test is successively read out thereof at an address specified by an address pattern signal.

A response output signal read out of the IC memory under test (hereinafter, also referred to simply as memory under test) is supplied to the logical comparator where it is logically compared with an expected value pattern data outputted from the pattern generator. If a result of the comparison indicates that there is an anti-coincidence or a mismatch therebetween, the logical comparator outputs a defective signal representing the anti-coincidence, namely, so-called failure data. Usually, as the failure data is outputted logical "1" which is a high logical level (logic H). By contrast, if a result of the comparison indicates that they coincide with each other, the logical comparator outputs a conforming or defectless signal representing the coincidence, namely, so-called pass data. Since the failure data is represented by logical "1", as the pass data is outputted logical "0" which is a low logical level (logic L). The failure data is fed to and stored in the failure analysis memory.

The failure analysis memory has the same operating rate or speed and storage capacity as those of the memory under test, and the same address pattern signal as that applied to the memory under test is applied to the failure analyses memory. In addition, the failure analysis memory is initialized prior to the start of a test. For example, when initialized, the failure analysis memory has data of logical "0s" written in all of the addresses thereof. Every time a failure data is generated from the logical comparator during a test of a memory under test, a failure data of logical "1" is written in the address of the failure analysis memory specified by the address pattern signal. That is, in a memory cell of the failure analysis memory having the same address as that of the failure memory cell of the memory under test is written the failure data (logical "1") indicating that failure memory cell of the memory under test.

Upon completion of one test cycle, a decision is rendered as to whether the memory under test is pass or failure in consideration of the number of failure data stored in the failure analysis memory, the locations where failure data occurred, and the like. By way of example, in case of utilizing the failure data stored in the failure analysis memory for purpose of relieving a defective memory cell of the memory under test, failure data read out of the failure analysis memory (information relating to the locations of defective memory cells of the memory under test) are totalled, and it is then determined based on the totalled failure data whether or not the locations of the detected failure memory cells can be relieved by relief means provided in the memory under test.

By contrast, when testing a ROM, test pattern data cannot be written in the ROM under test. Accordingly, there is provided a ROM expected value memory (constructed by a ROM) in which was previously stored the same data as the data which has previously written in the ROM under test, and the data read out of the ROM under test is logically compared with the expected value pattern data read out of the ROM expected value memory in the logical comparator which outputs a failure data in the event a result of the comparison indicates that there is an anti-coincidence or a mismatch therebetween.

FIG. 3 is a block diagram schematically showing the construction of a conventional memory testing apparatus provided with a ROM expected value memory. This memory testing apparatus is arranged to be capable of testing both a RAM and a ROM.

Referring to FIG. 3, the memory testing apparatus 100 comprises a timing generator 20 for generating a reference clock (operating clock) which controls the operation of various parts or components, a pattern generator 11 for outputting address pattern data, test pattern data, expected value pattern data and the like, an address waveform generator 21 for generating an address pattern signal having a real waveform corresponding to an input address pattern data, a data waveform generator 22 for generating a test pattern signal having a real waveform corresponding to an input test pattern data, a driver 23 for applying the address pattern signal of real waveform generated from the address waveform generator 21 to an IC memory under test 200, a driver 24 for applying the test pattern signal of real waveform generated from the data waveform generator 22 to the IC memory under test 200, an analog comparator 25 for determining whether or not a response output signal read out of the IC memory under test 200 in the form of logic level has a given voltage value, a logical comparator 26 for logically comparing data of the comparison result outputted from the analog comparator 25 with an expected value pattern data supplied from the pattern generator 11, and a failure analysis memory 27 for storing a failure data outputted from the logical comparator 26 each time both the data do not coincide with each other in the logical comparator, the failure data being stored in a memory cell of the failure analysis memory 27 at the address position specified by an address pattern data supplied from the pattern generator 11.

The pattern generator 11 comprises a controller 12 to which the reference clock is supplied from the timing generator 20 and which controls the timing generator 20, an address pattern generator 13 controlled by the controller 12 for generating address pattern data, a test pattern generator 14 controlled by the controller 12 for generating test pattern data, expected value pattern data and the like, a ROM expected value memory 16 for generating expected value pattern data for testing a ROM in a ROM testing mode in which ROMs are to be tested, a switching circuit 15 for supplying the test pattern data and the expected value pattern data generated from the test pattern generator 14 to the data waveform generator 22 and to the logical comparator 26 respectively in a RAM testing mode in which RAMs are to be tested as well as supplying the ROM testing expected value pattern data read out of the ROM expected value memory 16 to the logical comparator 26 in the ROM testing mode, a first delay circuit 18A for delaying the address pattern data outputted from the address pattern generator 13 by a given time interval D1, and a second delay circuit 18B for delaying the test pattern data outputted from the test pattern generator 14 by the same time interval D1.

Further, in the illustrated example, the arrangement is such that the operation of the data waveform generator 22 is inhibited in the ROM testing mode whereby only an address pattern signal is applied to the IC memory under test 200 (ROM).

As stated above, in order to test two kinds of memories, namely, a RAM and a ROM, heretofore, the ROM expected value memory 16 has been provided on the input side of the switching circuit 15 so that the switching circuit 15 can select either of the RAM testing test pattern data and expected value data generated from the test pattern generator 14 or the ROM testing expected value pattern data read out of the ROM expected value memory 16 to supply it to the data waveform generator 22 and the logical comparator 26.

Specifically, in the ROM testing mode, the address pattern data outputted from the address pattern generator 13 is applied to the ROM expected value memory 16 thereby to read the ROM testing expected value pattern data therefrom which is in turn outputted to the logical comparator 26 through the switching circuit 15.

To enable the memory testing apparatus to test a plurality of kinds of ROMs, the ROM expected value memory 16 is constructed by a RAM and the same data as that previously stored in a ROM under test has been written in this RAM. However, it should be understood that the ROM expected value memory 16 may be constructed by a ROM. The ROM expected value memory 16 involves a time lag or delay by nature between the time that the memory 16 is accessed and the time that the accessed data is read out thereof. Assuming that this time delay is represented by D1, unless the address pattern data supplied from the address pattern generator 13 to the address waveform generator 21 is delayed by the same time interval D1, the ROM testing expected value pattern data read out of the ROM expected value memory 16 and this address pattern data can not be fed in the same phase with each other to the logical comparator 26 and the address waveform generator 21.

In order to delay the address pattern data by the time interval D1, if the first delay circuit 18A having the time delay of D1 is inserted in a transmission path 17A for the address pattern data, it results in that the phase of a test pattern data supplied from the test pattern generator 14 to the data waveform generator 22 in the RAM testing mode differs from that of the address pattern data. Therefore, it becomes necessary to connect the second delay circuit 18B having the same time delay of D1 in a transmission path 17B for the test pattern data.

Thus, when the circuit arrangement shown in FIG. 3 is taken, the first delay circuit 18 and the second delay circuit 18B having the same time delay must be inserted in the transmission path 17A for the address pattern data and in the transmission path 17B for the test pattern data, respectively.

In addition, assuming that a delay time is represented by D2, which is a time interval from the time point that an address pattern data is inputted to the input terminal of the address waveform generator 21, followed by that a data is read from the IC memory under test 200 at the corresponding address and that the read data is fed to the logical comparator 26 through the analog comparator 25, and to the time point that a failure data is supplied to the input side of the failure analysis memory 27 (shown in FIG. 3 by a bold solid line with an arrow), an address pattern data directly applied from the address pattern generator 13 to the failure analysis memory 27 must be delayed by a time interval of D1+D2 in order to make the address pattern data in phase with the failure data applied to the failure analysis memory 27, where D1 represents the time delay caused by the transmission path 17A for the address pattern data Accordingly, it is necessary to insert a third delay circuit 18C having a time delay of (D1+D2) in a transmission path from the address pattern generator 13 to the failure analysis memory 27, as shown in FIG. 3.

It is to be understood that when an address pattern signal is applied to the address waveform generator 21 to read data from the IC memory under test 200, the expected value pattern data from the test pattern generator 14 or the expected value pattern data from the ROM expected value memory 16, one of which is outputted from the switching circuit 15 to the logical comparator 26, is normally matched in the logical comparator 26 in its phase with the phase of a data read out of the IC memory under test 200 and inputted to the logical comparator 26, and accordingly, an associated delay circuit is not shown. Obviously, a delay circuit may be used to match the phase of the expected value pattern data with the phase of the data read out of the IC memory under test 200 and inputted to the logical comparator 26.

Thus it will be seen that in the conventional memory testing apparatus 100 provided with the ROM expected value memory 16, there is a need to provide the first delay circuit 18A, the second delay circuit 18B and the third delay circuit 18C. The setting of the time delay in each of these delay circuits requires a troublesome operation because their relative time delay must be accurately defined, resulting in a disadvantage that the circuit arrangement becomes complicated. In addition, even though the time delays have been set up once, there are cases that the time delays may be varied due to change in temperature, with the lapse of time and the like, and hence a disadvantage occurs that much time and labor are required in its maintenance.

DISCLOSURE OF THE INVENTION

It is an object of the present invention to provide a memory testing apparatus provided with a ROM expected value memory in which its manufacture and maintenance are easy.

It is another object of the present invention to provide a method of switching the operation mode of a memory testing apparatus provided with a ROM expected value memory between a RAM testing mode and a ROM testing mode by which the manufacture of the testing apparatus can be made easy and the circuit arrangement thereof can be simplified.

According to a first aspect of the present invention, in order to accomplish the above first object, there is provided a memory testing apparatus which comprises: a pattern generator for outputting at least an address pattern data and a test pattern data; a waveform generator for converting the address pattern data and the test pattern data outputted from the pattern generator into an address pattern signal and a test pattern signal each having a real waveform; means for applying the address pattern signal and the test pattern signal outputted from the waveform generator to a memory under test; a ROM expected value memory for outputting a ROM expected value pattern data in a ROM testing mode; a first logical comparator for logically comparing a data read out of the memory under test with an expected value pattern data outputted from the pattern generator in a RAM testing mode; a second logical comparator for logically comparing a result of the logical comparison in the first logical comparator with a data outputted from the ROM expected value memory; and a failure analysis memory having the same address area as that of the memory under test for storing a failure data outputted from the second logical comparator at the same address as that of a memory cell in the memory under test where a failure has occurred, and wherein in the RAM testing mode, fixed data all bits of which have the same logic are outputted from the ROM expected value memory to be supplied to the second logical comparator, and in the ROM testing mode, fixed data all bits of which have the same logic are outputted from the pattern generator to be supplied to the first logical comparator.

In a preferred embodiment, the memory testing apparatus further comprises an analog comparator for determining whether or not the logical value of a response output signal read out of the memory under test has a given voltage value, and a data of the comparison result in the analog comparator is supplied to the first logical comparator.

In addition, the memory testing apparatus further comprises mode setting means which serves to supply, in the RAM testing mode, fixed data all bits of which have the same logic from the ROM expected value memory to the second logical comparator, and to supply, in the ROM testing mode, fixed data all bits of which have the same logic from the pattern generator to the first logical comparator.

In another preferred embodiment, there are provided pattern generator set-up means or programming means for setting or programming the pattern generator so that a predetermined pattern data is generated from the pattern generator and control means for controlling to supply fixed data all bits of which have the same logic from the ROM expected value memory to the second logical comparator in the RAM testing mode, and in the ROM testing mode, the pattern generator set-up means or programming means causes the pattern generator to generate fixed data all bits of which have the same logic and the control means causes the ROM expected value memory to generate a ROM expected value pattern data previously written in the ROM expected value memory therefrom.

In a further preferred embodiment, the pattern generator is set or programmed in the RAM testing mode such that a predetermined pattern data is generated from the pattern generator as well as fixed data previously written in the ROM expected value memory, all bits of which have the same logic, are generated from the ROM expected value memory, and the pattern generator is set or programmed in the ROM testing mode such that fixed data all bits of which have the same logic are generated from the pattern generator as well as a ROM expected value pattern data previously written in the ROM expected value memory is outputted therefrom.

Each of the first and the second logical comparators outputs logical "0" when both the inputs thereto coincide with each other and outputs logical "1" when both the inputs thereto do not coincide with each other. In addition, the fixed data outputted from the ROM expected value memory, all bits of which have the same logic, comprise logical "0s" in the RAM testing mode, and the fixed data outputted from the pattern generator, all bits of which have the same logic, also comprise logical "0s" in the ROM testing mode.

Further, a first delay circuit is inserted in a transmission path for an address pattern data supplied from the pattern generator to the failure analysis memory, and a second delay circuit is inserted in a transmission path for an address pattern data supplied from the pattern generator to the ROM expected value memory, and the first delay circuit has a delay time substantially equal to a time interval from the time point that an address pattern data is supplied to the waveform generator until the time point that a data read out of the memory under test is logically compared in the first logical comparator and a result of the logical comparison is outputted therefrom, and the second delay circuit has a delay time equal to a time interval in which a time duration taken from the time point that the ROM expected value memory is accessed and to the time point that the stored data is read out thereof is subtracted from the delay time of the first delay circuit.

With the construction described above, the ROM testing expected value pattern data read out of the ROM expected value memory is applied alone only to the second logical comparator, and no other signal is transmitted on the signal path on which the expected value pattern data propagates. Accordingly, a time delay associated with reading of the ROM expected value memory has no influence upon other signals, and hence it is unnecessary to provide any delay circuit in the pattern generator.

In this manner, no delay circuit is needed to be provided in transmission paths on which an address pattern data and a test pattern data propagate respectively in the RAM testing mode, and thus, the number of delay circuits used can be reduced, and the setting and the control of delay times can be made easy. In addition, the maintenance can also be facilitated.

According to a second aspect of the present invention, in order to accomplish the above second object, there is provided a method of switching the memory testing apparatus constructed as stated above between the RAM testing mode and the ROM testing mode, which comprises the steps of: setting or programming the pattern generator so that a predetermined pattern data is generated from the pattern generator; and previously writing a predetermined data in the ROM expected value memory, and the testing apparatus is switched in the operation mode to one of the RAM testing mode and the ROM testing mode by combination of the setting or programming of the pattern generator and the data previously written in the ROM expected value memory.

In a preferred specific embodiment, in the RAM testing mode, fixed data all bits of which have the same logic are previously written in the ROM expected value memory as well as a RAM testing pattern data is generated from the pattern generator by the setting of the pattern generator, and in the ROM testing mode, a ROM testing pattern data is previously written in the ROM expected value memory as well as fixed data all bits of which have the same logic are generated from the pattern generator by the setting of the pattern generator.

In another preferred specific embodiment, in the RAM testing mode, fixed data all bits of which have the same logic are previously written in the ROM expected value memory as well as a RAM testing pattern data is generated from the pattern generator by the program, and in the ROM testing mode, a ROM testing pattern data is previously written in the ROM expected value memory as well as fixed data all bits of which have the same logic are generated from the pattern generator by the program.

BEST MODE OF CARRYING OUT THE INVENTION

An embodiment of the present invention will now be described in detail with reference to FIGS. 1 and 2.

Figure 1:
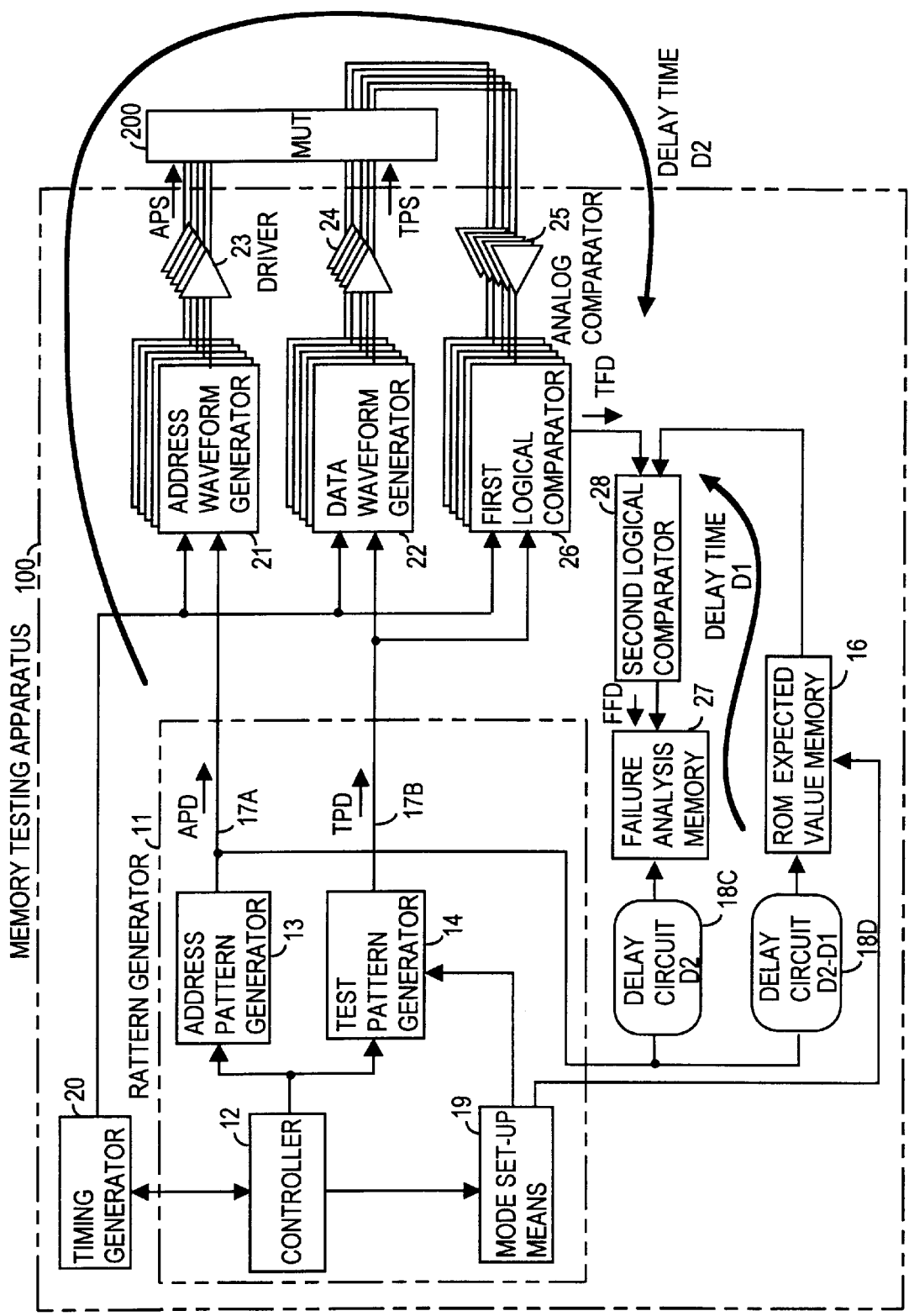
FIG. 1 is a block diagram schematically showing the construction of an embodiment of the memory testing apparatus according to the present invention.
Figure 3:
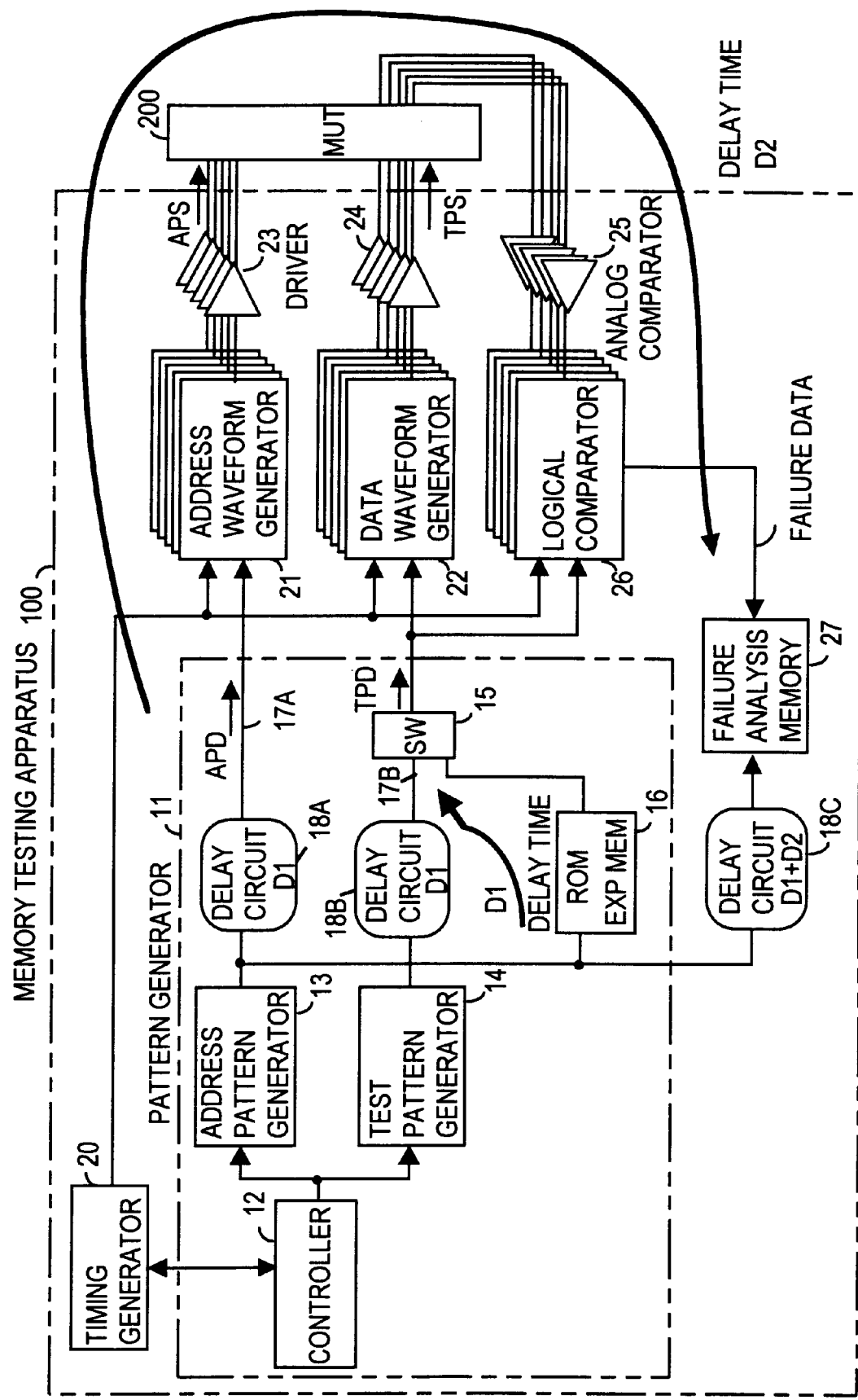
FIG. 3 is a block diagram showing an example of the conventional memory testing apparatus provided with a ROM expected value memory.

FIG. 1 is a block diagram schematically showing the construction of one embodiment of the memory testing apparatus according to the present invention. In FIG. 1, elements, circuits and parts corresponding to those in the memory testing apparatus shown in FIG. 3 have the same characters attached thereto and the explanation thereof will be omitted unless necessary.

In this embodiment, an address pattern data generated from an address pattern generator 13 is directly fed to an address waveform generator 21, and a test pattern data generated from a test pattern generator 14 is directly fed to a data waveform generator 22 and a logical comparator 26 (hereinafter referred to as first logical comparator). Accordingly, there is provided no delay circuit in a transmission path 17A for the address pattern data and a transmission path 17B for the test pattern data.

A second logical comparator 28 is provided on the output side of the first logical comparator 26, and has one input terminal to which a data of a result of the logical comparison in the first logical comparator 26 is inputted and the other input terminal to which an expected value pattern data for testing ROM read out of a ROM expected value memory 16 is inputted.

An output from the second logical comparator 28 is fed to a failure analysis memory 27 thereby storing a final failure data therein. An address pattern data from the address pattern generator 13 is fed to the failure analysis memory 27 through a third delay circuit 18C having a delay time of D2, and is also fed to a ROM expected value memory 16 through a fourth delay circuit 18D having a delay time of (D2–D1). It is to be noted that the delay time D1 corresponds to a time interval taken from the time point that the ROM expected value memory 16 is accessed and to the time point that the stored data is read out thereof, and the delay time D2 corresponds to a time interval taken from the time point that an address pattern data is inputted to the input terminal of the address waveform generator 21, followed by that a data is read from the IC memory under test 200 at the corresponding address and that the read data is fed to the first logical comparator 26 through the analog comparator 25, and to the time point that a failure data is outputted to the output terminal of the first logical comparator 26 (shown in FIG. 1 by a bold solid line with an arrow) shown by a thick solid line with an arrow in FIG. 1.

Like the conventional memory testing apparatus discussed previously, when an address pattern signal is applied to the address waveform generator 21 to read data from the IC memory under test 200, the expected value pattern data supplied from the test pattern generator 14 to the first logical comparator 26 is normally matched in the logical comparator 26 in its phase with the phase of a data read out of the IC memory under test 200 and inputted to the logical comparator 26, and accordingly, an associated delay circuit is not shown. It is needless to say that a delay circuit may be used to match the phase of the expected value pattern data with the phase of the data read out of the IC memory under test 200 and inputted to the first logical comparator 26.

The pattern generator 11 further includes a mode set-up means 19 which applies control signals to the test pattern generator 14 and the ROM expected value memory 16 to control the pattern generation therefrom in accordance with the testing mode. Specifically, in the RAM testing mode, the test pattern generator 14 generates, in response to a control signal supplied from the mode set-up means 19 thereto, a RAM testing test pattern data which is then fed to the data waveform generator 22. However, a control signal supplied from the mode set-up means 19 to the RAM expected value memory 16 inhibits the stored data in the memory 16 from being read out thereof and hence the memory 16 outputs data all bits of which have a fixed logic of either logical "1" or logical "0" to the second logical comparator 28. In the following description, this embodiment will be discussed assuming that the RAM expected value memory 16 outputs the data all bits of which have a fixed logic of logical "0" to the second logical comparator 28.

On the other hand, in the ROM testing mode, a control signal supplied from the mode set-up means 19 to the test pattern generator 14 inhibits the test pattern generator 14 from generating a test pattern data therefrom, and then the test pattern generator 14 outputs data all bits of which have a fixed logic of logical "0" in this example to the first logical comparator 26. In contrast, a control signal supplied from the mode set-up means 19 to the ROM expected value memory 16 enables the stored data in the memory 16 to be read out of the memory 16. As a result, the stored data in the memory 16 is read out in accordance with an address pattern data supplied from the address pattern generator 13 to the ROM expected value memory 16 to be outputted to the second logical comparator 28.

Figure 2:
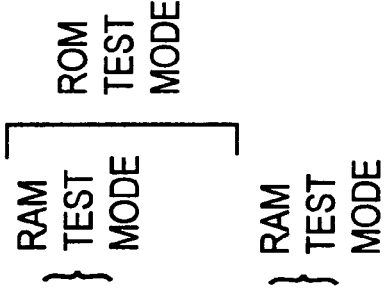
FIG. 2 is a diagram explaining the operation of the main parts of the memory testing apparatus shown in FIG. 1.

FIG. 2 shows a truth table listing all possible combinations of test pattern data, data read out of the memory under test 200 (which is ROM in this example), and data read out of the ROM expected value memory 16. Each of the first and the second logical comparators 26 and 28 outputs logical "0" whenever both the input data thereto coincide with each other, and outputs logical "1" whenever both the input data thereto do not coincide with each other.

In FIG. 2, a portion of the truth table corresponding to test timings T1–T4 indicates all possible combinations which occur when the test pattern data represents logical "0" while the rest of the truth table corresponding to the test timings T5–T8 indicates all possible combinations which occur when the test pattern data is logical "1".

As shown in FIG. 2, if a data read out of the memory under test 200 (which is ROM in this example) is logical "0" at test timing T1, both the input data coincide with each other, and hence a temporary failure data outputted from the first logical comparator 26 is logical "0". If data read out from the ROM expected value memory 16 is logical "0", the temporary failure data is also logical "0", and hence a final failure data outputted from the second logical comparator 28 is also logical "0" representing the coincidence between both the data.

At test timing T2, when a data read out of the memory under test 200 is logical "1", both the input data do not coincide with each other, and hence the first logical comparator 26 outputs a temporary failure data of logical "1". If a data read out of the ROM expected value memory 16 is logical "0", the final failure data will be logical "1" representing the anti-coincidence between both the data since the temporary failure data is logical "1".

At test timing T3, when a data read out of the memory under test 200 is logical "0", both the input data coincide with each other, and hence the first logical comparator 26 outputs a temporary failure data of logical "0". If a data read out of the ROM expected value memory 16 is logical "1", the final failure data will be logical "1" representing the anti-coincidence between both the data since the temporary failure data is logical "0".

At test timing T4, when a data read out of the memory under test 200 is logical "1", both the input data do not coincide with each other, and hence the first logical comparator 26 outputs a temporary failure data of logical "1". If a data read out of the ROM expected value memory 16 is logical "1", the final failure data will be logical "0" representing the coincidence between both the data since the temporary failure data is logical "1".

At test timing T5, when a data read out of the memory under test 200 is logical "0", both the input data do not coincide with each other, and hence the first logical comparator 26 outputs a temporary failure data of logical "1". If a data read out of the ROM expected value memory 16 is logical "0", the final failure data will be logical "1" representing the anti-coincidence between both the data since the temporary failure data is logical "1".

At test timing T6, when a data read out of the memory under test 200 is logical "1", both the input data coincide with each other, and hence the first logical comparator 26 outputs a temporary failure data of logical "0". If a data read out of the ROM expected value memory 16 is logical "0", the final failure data will be logical "0" representing the coincidence between both the data since the temporary failure data is logical "0".

At test timing T7, when a data read out of the memory under test 200 is logical "0", both the input data do not coincide with each other, and hence the first logical comparator 26 outputs a temporary failure data of logical "1". If a data read out of the ROM expected value memory 16 is logical "1", a result of the comparison in the second logical comparator 28 will be logical "0" representing the coincidence between both the data since the temporary failure data is logical "1".

At test timing T8, when a data read out of the memory under test 200 is logical "1", both the input data coincide with each other, and hence the first logical comparator 26 outputs a temporary failure data of logical "0". If a data read out of the ROM expected value memory 16 is logical "1", the second logical comparator 28 will output logical "1" representing the anti-coincidence between both the data since the temporary failure data is logical "0".

As discussed above, in the ROM testing mode, any test pattern data (or expected value pattern data) is logical "0" at every test timing. Accordingly, the test timings T1 to T4 can be used in the ROM testing mode. The test timings T1 and T2 can also be used in the RAM testing mode since the output data from the ROM expected value memory 16 in the test timings T1 and T2 are logical "0s".

On the other hand, in the test timings T5–T8, any test pattern data is logical "1", and hence the test timings T5–T8 cannot be used in the ROM testing mode. Since the test pattern data in the RAM testing mode is a pattern data in which logical "1" and logical "0" are combined in a predetermined sequence, there is a possibility that the test timings T5–T8 can be used in the RAM testing mode. However, in the RAM testing mode, the output data from the ROM expected value memory 16 has a logical level fixed to logical "0" at every test timing as mentioned previously. Accordingly, only the test timings T5 and T6 can be used in the RAM testing mode.

Test timings T7 and T8 in which the test pattern data is logical "1" and the output data from the ROM expected value memory 16 is also logical "1" represent a state which cannot be set in practice, and obviously cannot be used in the RAM testing mode.

Further, in the embodiment described above, the mode set-up means 19 is provided to apply control signals to the test pattern generator 14 and the ROM expected value memory 16 respectively thereby switching the operation mode of the memory testing apparatus between the ROM testing mode and the RAM testing mode. However, it is possible to switch the operation mode of the memory testing apparatus between the ROM testing mode and the RAM testing mode without providing the mode set-up means 19. An example thereof will be described below.

The pattern generator 11 is normally arranged in the RAM testing mode so as to generate a predetermined test pattern data by previously setting the pattern generator 11 or a program. On the other hand, as stated above, the same data as the data stored in the memory under test is previously written in the ROM expected value memory 16, and accordingly, a combination of the setting of the pattern generator 11 or a program for operating the pattern generator 11 and the data previously written in the ROM expected value memory 16 may be used to switch between the test timings T1–T4 (ROM testing mode) and T1, T2, T5 and T6 (RAM testing mode) as illustrated in FIG. 2, for instance.

For example, if the pattern generator 11 may be set or a program for operating the pattern generator 11 may be prepared in the ROM testing mode such that the test pattern data (or expected value pattern data) of logical "0" is generated at any test timing and control means may cause data previously written in the ROM expected value memory 16 to be outputted therefrom, and in the RAM testing mode, the control means may cause data of logical "0" to be outputted from the ROM expected value memory 16 and the pattern generator 11 may be set or a program for operating the pattern generator 11 may be prepared so that a predetermined test pattern data and an expected value pattern data in which logical "0" and logical "1" are combined can be generated, it is possible to switch between the ROM testing mode and the RAM testing mode without providing the mode set-up means 19.

Alternatively, if the pattern generator 11 may be set or a program for operating the pattern generator 11 may be prepared in the ROM testing mode such that the test pattern data (or expected value pattern data) of logical "0" is generated at any test timing and the same data as the data previously written in the memory under test may be generated from the ROM expected value memory 16, and in the RAM testing mode, the pattern generator 11 may be set or a program for operating the pattern generator 11 may be prepared so that a predetermined test pattern data and an expected value pattern data in which logical "0" and logical "1" are combined can be generated and fixed data previously written in the ROM expected value memory 16, all bits of which are logical "0", may be generated from the ROM expected value memory 16, it is no need for providing a separate mode set-up means in the memory testing apparatus.

Generally speaking, the latter technique is more frequently adopted (only the pattern generator 11 is set or programmed and fixed data all bits of which have the same logic or the same data previously written in the ROM expected value memory 16 as the data stored in the memory under test is generated from the ROM expected value memory 16 depending on the mode).

As described above, the memory testing apparatus according to the present invention operates in the ROM testing mode such that expected value pattern data supplied from the test pattern generator 14 to the first logical comparator 26 are fixed to logical "0" in all bits, all data read out of the memory under test 200 (ROM) are sequentially compared with logical "0" in the first logical comparator 26 which in turn outputs temporary failure data as the comparison results, the temporary failure data are sequentially compared with normal expected value pattern data read out of the ROM expected value memory 16 in the second logical comparator 28, and then correct final failure data are obtained from the second logical comparator 28. In the RAM testing mode, the memory testing apparatus operates such that data read out of the memory under test 200 (RAM) are sequentially compared with normal expected value pattern data supplied from the test pattern generator 14 in the first logical comparator 26, and the comparison results are sequentially compared with data all bits of which are logical "0" in the second logical comparator 28. In this instance, the comparison results of in the second logical comparator 28 becomes the same as the comparison results in the first logical comparator 26, and hence it will be understood that correct failure data can be also obtained in the RAM testing mode.

In accordance with the present invention, a method of switching the above-described memory testing apparatus between the ROM testing mode and the RAM testing mode can be provided by utilizing a combination of the set-up of the pattern generator 11 or a program for operating the pattern generator 11 and data previously written in the ROM expected value memory 16.

As described above, in accordance with the present invention, there are no need for providing delay circuits in the test pattern generator, and hence a cumbersome operation or works required for setting the delay times can be eliminated and the circuit arrangement can be simplified. Accordingly, the manufacture is facilitated, and no change in the delay times are caused by change in temperature or with the lapse of time, resulting in an advantage that the maintenance can be made easy.

The need for the provision of a separate mode set-up means in the memory testing apparatus can be eliminated by adopting a technique in which, in the RAM testing mode, the pattern generator is previously set or a program is prepared for operating the pattern generator so that it generates a desired test pattern data, and data previously written in the ROM expected value memory 16 are generated from the ROM expected value memory 16 or fixed data all bits of which have the same logic are generated by control means, and in the ROM testing mode, the pattern generator is previously set or a program is prepared for operating the pattern generator so that it generates fixed data all bits of which have the same logic and the same data previously written in the ROM expected value memory 16 as the data stored in the memory under test are generated from the ROM expected value memory 16. As a result, there are obtained advantages that the circuit arrangement can be farther simplified and the manufacture can be further facilitated.

While the embodiment has been described above in connection with a testing of IC memory, it should be understood that the memory testing apparatus according to the present invention is also applicable to testing memories other than IC memory with similar functioning and effect.

What is claimed is:

1. A memory testing apparatus comprising:

a pattern generator for outputting at least an address pattern data and a test pattern data;

a waveform generator for converting the address pattern data and the test pattern data outputted from said pattern generator into an address pattern signal and a test pattern signal each having a real waveform;

means for applying the address pattern signal and the test pattern signal outputted from said waveform generator to a memory under test;

a ROM expected value memory for outputting a ROM expected value pattern data in a ROM testing mode;

a first logical comparator for logically comparing a data read out of the memory under test with an expected value pattern data outputted from said pattern generator in a RAM testing mode;

a second logical comparator for logically comparing a result of the logical comparison in said first logical comparator with a data outputted from said ROM expected value memory; and a failure analysis memory having the same address area as that of the memory under test for storing a failure data outputted from said second logical comparator at the same address as that of a memory cell in the memory under test where a failure has occurred, said memory testing apparatus being characterized in that in the RAM testing mode, fixed data all bits of which have the same logic are outputted from said ROM expected value memory to be supplied to said second logical comparator, and in the ROM testing mode, fixed data all bits of which have the same logic are outputted from said pattern generator to be supplied to said first logical comparator.

2. The memory testing apparatus according to claim 1, further comprising an analog comparator for determining whether or not the logical value of a response output signal read out of the memory under test has a given voltage value, and wherein a data of the comparison result in said analog comparator is supplied to said first logical comparator.

3. The memory testing apparatus according to claim 1 or claim 2, further comprising mode setting means which serves to supply, in the RAM testing mode, fixed data all bits of which have the same logic from said ROM expected value memory to said second logical comparator, and to supply, in the ROM testing mode, fixed data all bits of which have the same logic from said pattern generator to said first logical comparator.

4. The memory testing apparatus according to claim 1 or claim 2, further comprising:

pattern generator set-up means for setting said pattern generator so that a predetermined pattern data is generated from said pattern generator in the RAM testing mode as well as fixed data all bits of which have the same logic are generated therefrom in the ROM testing mode; and control means for controlling said ROM expected value memory so that fixed data all bits of which have the same logic are outputted from said ROM expected value memory in the RAM testing mode as well as a ROM expected value pattern data previously written therein is outputted therefrom in the ROM testing mode.

5. The memory testing apparatus according to claim 1 or claim 2, further comprising:

programming means for programming said pattern generator so that a predetermined pattern data is generated from said pattern generator in the RAM testing mode as well as fixed data all bits of which have the same logic are generated therefrom in the ROM testing mode; and control means for controlling said ROM expected value memory so that fixed data all bits of which have the same logic are outputted from said ROM expected value memory in the RAM testing mode as well as a ROM expected value pattern data previously written therein is outputted therefrom in the ROM testing mode.

6. The memory testing apparatus according to claim 1 or claim 2, wherein said pattern generator is set in the RAM testing mode such that a predetermined pattern data is generated from said pattern generator as well as fixed data previously written in said ROM expected value memory, all bits of which have the same logic, are generated from said ROM expected value memory, and said pattern generator is set in the ROM testing mode such that fixed data all bits of which have the same logic are outputted from said pattern generator as well as a ROM expected value pattern data previously written in said ROM expected value memory is outputted therefrom.

7. The memory testing apparatus according to claim 1 or claim 2, wherein in thee RAM testing mode, a program is prepared for operating said pattern generator so that a predetermined pattern data is generated from said pattern generator as well as fixed data previously written in said ROM expected value memory, all bits of which have the same logic, are generated from said ROM expected value memory, and in the ROM testing mode, a program is prepared for operating said pattern generator so that fixed data all bits of which have the same logic are outputted from said pattern generator as well as a ROM expected value pattern data previously written in said ROM expected value memory is outputted therefrom.

8. The memory testing apparatus according to claim 1, wherein each of said first and said second logical comparators outputs logical "0" when both the inputs thereto coincide with each other and outputs logical "1" when both the inputs thereto do not coincide with each other.

9. The memory testing apparatus according to claim 1, wherein the fixed data all bits of which have the same logic outputted from said ROM expected value memory in the RAM testing mode comprise logical "0s", and the fixed data all bits of which have the same logic outputted from said pattern generator in the ROM testing mode also comprise logical "0s".

10. The memory testing apparatus according to claim 1 or claim 2, wherein a first delay circuit is inserted in a transmission path for an address pattern data supplied from said pattern generator to said failure analysis memory, and a second delay circuit is inserted in a transmission path for an address pattern data supplied from said pattern generator to said ROM expected value memory, said first delay circuit having a delay time substantially equal to a time interval from the time point that an address pattern data is supplied to said waveform generator until the time point that a data read out of the memory under test is logically compared in said first logical comparator and a result of the logical comparison is outputted therefrom, said second delay circuit having a delay time equal to a time interval in which a time duration taken from the time point that said ROM expected value memory is accessed and to the time point that the stored data is read out thereof is subtracted from said delay time of the first delay circuit.

11. A method of switching the memory testing apparatus claimed in claim 1 between the RAM testing mode and the ROM testing mode, comprising the steps of:

in the RAM testing mode, generating fixed data all bits of which have the same logic from said ROM expected value memory without previously writing any data in said ROM expected value memory as well as setting said pattern generator to generate a RAM testing pattern data therefrom; and in the ROM testing mode, generating a ROM testing pattern data previously written in said ROM expected value memory therefrom as well as setting said pattern generator to generate fixed data all bits of which have the same logic therefrom.

12. A method of switching the memory testing apparatus claimed in claim 1 between the RAM testing mode and the ROM testing mode, comprising the steps of:

in the RAM testing mode, generating fixed data previously written in said ROM expected value memory, all bits of which have the same logic, therefrom as well as setting said pattern generator to generate a RAM testing pattern data therefrom; and in the ROM testing mode, generating a ROM testing pattern data previously written in said ROM expected value memory therefrom as well as setting said pattern generator to generate fixed data all bits of which have the same logic therefrom.

13. A method of switching the memory testing apparatus claimed in claim 1 between the RAM testing mode and the ROM testing mode, comprising the steps of:

in the RAM testing mode, generating fixed data all bits of which have the same logic from said ROM expected value memory without previously writing any data in said ROM expected value memory as well as generating a RAM testing pattern data from said pattern generator by means of a program for operating said pattern generator; and in the ROM testing mode, generating a ROM testing pattern data previously written in said ROM expected value memory therefrom as well as generating fixed data all bits of which have the same logic from said pattern generator by means of a program for operating said pattern generator.

14. A method of switching the memory testing apparatus claimed in claim 1 between the RAM testing mode and the ROM testing mode, comprising the steps of:

in the RAM testing mode, generating fixed data previously written in said ROM expected value memory, all bits of which have the same logic, therefrom as well as generating a RAM testing pattern data from said pattern generator by means of a program for operating said pattern generator; and in the ROM testing mode, generating a ROM testing pattern data previously written in said ROM expected value memory therefrom as well as generating fixed data all bits of which have the same logic from said pattern generator by means of a program for operating said pattern generator.

* * * * *